US010598860B2

(12) United States Patent
Ramachandran et al.

(10) Patent No.: US 10,598,860 B2
(45) Date of Patent: Mar. 24, 2020

(54) PHOTONIC DIE FAN OUT PACKAGE WITH EDGE FIBER COUPLING INTERFACE AND RELATED METHODS

(71) Applicant: GLOBALFOUNDRIES INC., Grand Cayman (KY)

(72) Inventors: Koushik Ramachandran, Wappingers Falls, NY (US); Benjamin V. Fasano, New Windsor, NY (US); Edmund D. Blackshear, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/920,537

(22) Filed: Mar. 14, 2018

(65) Prior Publication Data

US 2019/0285804 A1    Sep. 19, 2019

(51) Int. Cl.
| | |
|---|---|
| *G02B 6/30* | (2006.01) |
| *G02B 6/38* | (2006.01) |
| *G02B 6/44* | (2006.01) |

(52) U.S. Cl.
CPC ............. *G02B 6/30* (2013.01); *G02B 6/3846* (2013.01); *G02B 6/4471* (2013.01)

(58) Field of Classification Search
CPC ..................................... G02B 6/30; G02B 6/38
USPC .......................................................... 385/14
See application file for complete search history.

(56) References Cited

U.S. PATENT DOCUMENTS

| | | | | |
|---|---|---|---|---|
| 5,879,173 A | * | 3/1999 | Poplawski | G02B 6/4246 439/138 |
| 5,960,141 A | * | 9/1999 | Sasaki | G02B 6/421 385/88 |
| 6,267,606 B1 | * | 7/2001 | Poplawski | C07D 491/22 361/752 |
| 6,309,566 B1 | * | 10/2001 | Muller | G02B 6/4201 264/1.25 |
| 6,422,766 B1 | * | 7/2002 | Althaus | G02B 6/4259 385/94 |
| 6,456,766 B1 | * | 9/2002 | Shaw | G02B 6/30 385/47 |

(Continued)

FOREIGN PATENT DOCUMENTS

| | | |
|---|---|---|
| EP | 3159721 A1 | 4/2017 |
| WO | 2016153484 A1 | 9/2016 |

*Primary Examiner* — Kaveh C Kianni
(74) *Attorney, Agent, or Firm* — Anthony Canale; Hoffman Warnick LLC

(57) ABSTRACT

A photonic integrated circuit (PIC) fan-out package and related methods of forming same are disclosed. The PIC fan-out package includes: an overmold body; a PIC die in the overmold body, the PIC die including electro-optic circuitry; a plurality of optical fiber stubs operatively coupled to the electro-optic circuitry; an edge fiber coupling interface in a lateral side of the overmold body for coupling the plurality of optical fiber stubs to external optical fibers using a connector; an ancillary device in the overmold body; a redistribution wiring layer (RDL) interposer adjacent the overmold body and electrically connected to the PIC die and the ancillary device; and a ball grid array (BGA) electrically coupled to the PIC die and the ancillary device by the RDL interposer, the BGA configured to electrically couple the PIC die and the ancillary device to a printed circuit board (PCB).

20 Claims, 11 Drawing Sheets

(56) References Cited

U.S. PATENT DOCUMENTS

| | | | | |
|---|---|---|---|---|
| 7,015,454 B2* | 3/2006 | Stone | G02B 6/4206 | 250/208.1 |
| 7,050,678 B1* | 5/2006 | Isono | G02B 6/423 | 385/15 |
| 7,446,298 B1* | 11/2008 | Stone | G02B 6/4206 | 250/216 |
| 7,939,791 B1* | 5/2011 | Stone | G02B 6/4206 | 250/216 |
| 9,864,133 B2* | 1/2018 | Patel | G02B 6/305 | |
| 2002/0028045 A1* | 3/2002 | Yoshimura | G02B 6/10 | 385/50 |
| 2002/0039464 A1* | 4/2002 | Yoshimura | G02B 6/10 | 385/14 |
| 2002/0097962 A1* | 7/2002 | Yoshimura | G02B 6/10 | 385/50 |
| 2002/0104959 A1* | 8/2002 | Arsenault | G02B 6/42 | 250/227.11 |
| 2003/0026168 A1* | 2/2003 | Behn | G01V 1/22 | 367/76 |
| 2003/0171022 A1* | 9/2003 | Distad | G02B 6/4261 | 439/372 |
| 2005/0111781 A1* | 5/2005 | Jain | G02B 6/43 | 385/15 |
| 2006/0013542 A1* | 1/2006 | Schunk | G02B 6/4201 | 385/92 |
| 2006/0140630 A1* | 6/2006 | Popovich | F28F 1/122 | 398/58 |
| 2009/0003761 A1* | 1/2009 | Matsuoka | G02B 6/42 | 385/14 |
| 2012/0001166 A1* | 1/2012 | Doany | G02B 6/4246 | 257/43 |
| 2013/0114924 A1 | 5/2013 | Loh et al. | | |
| 2014/0203175 A1* | 7/2014 | Kobrinsky | G02B 6/428 | 250/214.1 |
| 2014/0254968 A1 | 9/2014 | Nakagawa et al. | | |
| 2014/0270784 A1* | 9/2014 | Thacker | G02B 6/4284 | 398/115 |
| 2015/0037044 A1* | 2/2015 | Peterson | G02B 6/4292 | 398/135 |
| 2015/0219850 A1 | 8/2015 | Fish et al. | | |
| 2016/0274318 A1* | 9/2016 | Vallance | G02B 6/428 | |
| 2017/0045697 A1 | 2/2017 | Hochberg et al. | | |
| 2018/0047713 A1* | 2/2018 | Yim | H01L 23/5389 | |
| 2018/0196196 A1* | 7/2018 | Byrd | G02B 6/13 | |
| 2019/0019899 A1* | 1/2019 | Wang | H04B 10/6971 | |
| 2019/0041591 A1* | 2/2019 | Low | G02B 6/4257 | |

* cited by examiner

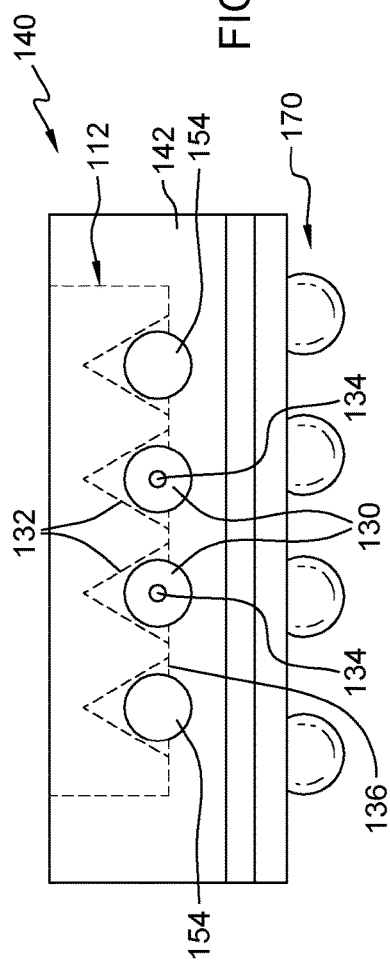
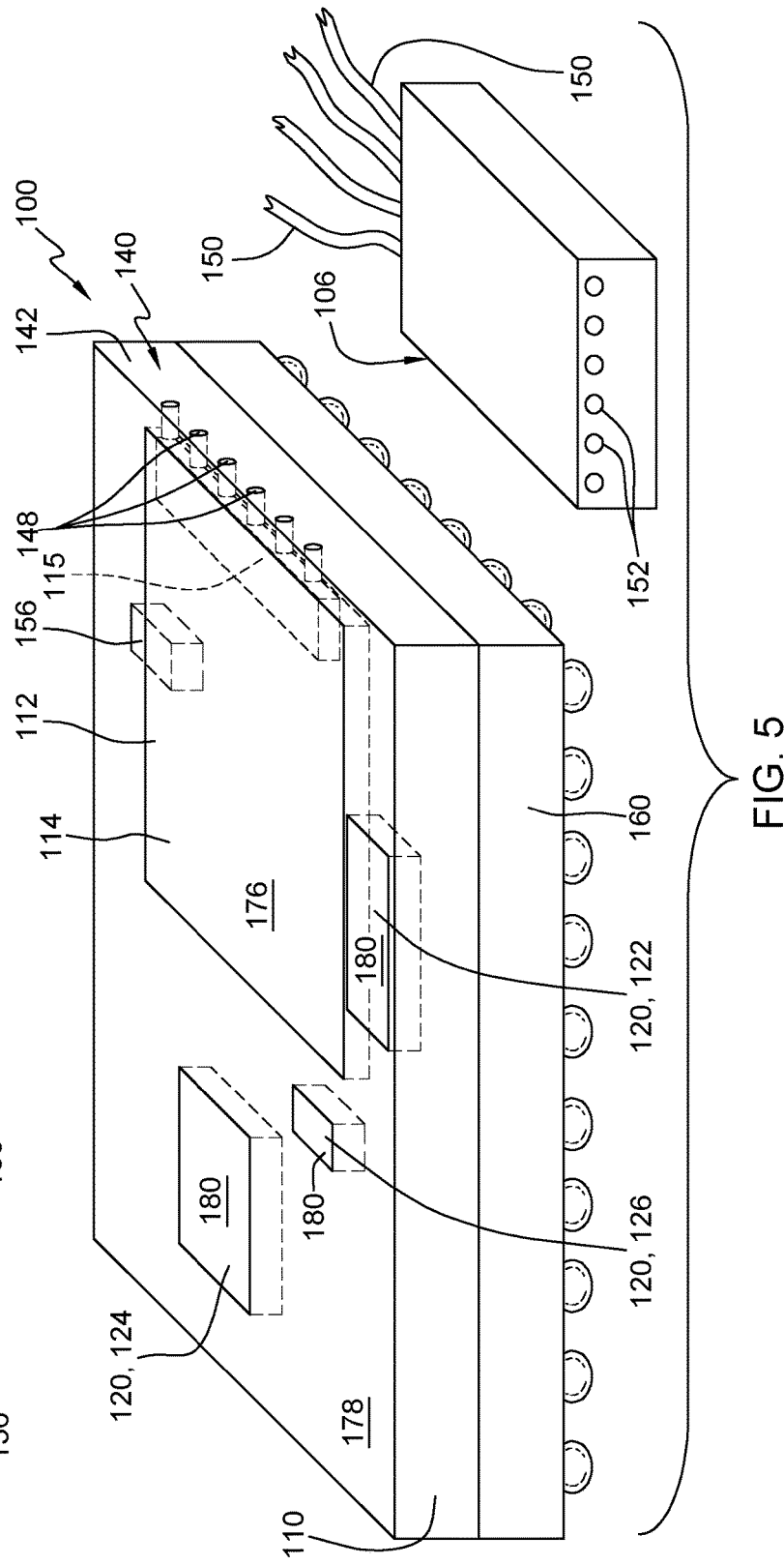

PHOTONIC DIE FAN OUT PACKAGE WITH EDGE FIBER COUPLING INTERFACE AND RELATED METHODS

BACKGROUND

The present disclosure relates to photonic integrated circuit (PIC) die packaging, and more specifically, to PIC die packaging having side optical fiber connections.

Current photonic integrated circuit (PIC) dies require complex packaging integration schemes. One challenge is providing optical coupling between the PIC die and external optical links such as optical fibers or polymer waveguides. For example, very precise alignment tolerances must be observed when attaching input and output fibers to efficiently couple light between the optical waveguides of the PIC die and off-module connections. Another challenge is that these PIC die often require surface wire bonding interconnections to their support or carrier substrate and therefore typically have a low number of electrical input/output connections. The wire bonding provides limited perimeter electrical input/outputs unless using very fine pitch interconnects. Additionally, the wiring bonding makes it difficult to efficiently cool the PIC die since heat flow from the back of the PIC die is into a laminate versus a direct heat spreader contact to the backside of the die as with a flip chip attached die. Flip chip integration of PIC dies can provide more electrical inputs/outputs, however the V-grooves for optical fiber alignment to the PIC waveguides are on the device side of the PIC die, which makes flip chip integration of such PIC dies challenging because the V-grooves are not easily accessible for fiber connections after flip chip assembly of the PIC die. Furthermore, the current photonics packaging technology provides low component integration density, particularly where ancillary devices such as trans-impedance amplifiers (TIAs), drivers, memory and passive components need to be integrated in a single module.

SUMMARY

A first aspect of the disclosure is directed to a photonic integrated circuit (PIC) fan-out package, including: an overmold body; a PIC die in the overmold body, the PIC die including electro-optical circuitry having an optical waveguide system; a plurality of optical fiber stubs operatively coupled to the optical waveguide system and extending from a lateral side of the PIC die through a portion of the overmold body; an edge fiber coupling interface in a lateral side of the overmold body for coupling the plurality of optical fiber stubs to external optical fibers using a connector; an ancillary device in the overmold body; a redistribution wiring layer (RDL) interposer adjacent the overmold body and electrically connected to the PIC die and the ancillary device; and a ball grid array (BGA) electrically coupled to the PIC die and the ancillary device by the RDL interposer, the BGA configured to electrically couple the PIC die and the ancillary device to a printed circuit board (PCB).

A second aspect of the disclosure includes a method, including: mounting a plurality of sets of a photonic integrated circuit (PIC) die and an ancillary device to a carrier, each PIC die and each ancillary device having electrical connection points on an opposing vertically facing side thereof from the carrier, each PIC die including a plurality of V-groove fiber optic receptacles, at least two of the plurality of V-groove fiber optic receptacles each configured to receive and operatively couple an optical fiber stub to the respective PIC die; individually mounting an optical fiber stub into each of the at least two of the plurality of V-groove receptacles, each optical fiber stub protruding from a lateral side of the respective PIC die; overmolding of the plurality of sets of the PIC die and the ancillary device on the carrier; forming a redistribution layer (RDL) interposer for each PIC die of the plurality of sets, each RDL interposer electrically connected to at least one of the PIC die and the ancillary device; removing the carrier, creating a set of connected modules, each module including a selected PIC die and a selected ancillary device; dicing a selected module from the set of modules; forming an edge fiber coupling interface by exposing a portion of each optical fiber stub on the lateral side of the overmold body of the selected module; and forming a ball grid array (BGA) on the RDL interposer of the selected module, the BGA being electrically connected to the PIC die and the ancillary device by the RDL interposer, the BGA configured to electrically couple the PIC die and the ancillary device to a printed circuit board (PCB).

A third aspect of the disclosure related to a method, including: mounting a plurality of photonic integrated circuit (PIC) dies to a first carrier, each PIC die including a plurality of V-groove receptacles on an opposing vertically facing side of the respective PIC die from the first carrier, at least two of the plurality of V-groove receptacles each configured to receive and operatively couple an optical fiber stub to the respective PIC die; individually mounting an optical fiber stub into each of the at least two of the plurality of V-groove receptacles; separating each PIC die from the first carrier; mounting a plurality of sets of a selected PIC die and an ancillary device to a second carrier, wherein the plurality of V-groove receptacles and the optical fiber stubs are adhered to the second carrier; overmolding of the plurality of sets on the second carrier; removing the second carrier, creating a set of connected modules, each module including a selected PIC die and a respective ancillary device; forming a redistribution layer (RDL) interposer for each of the plurality of connected modules, each RDL interposer electrically connected to the selected PIC die and the respective ancillary device of a respective connected module; dicing a selected module from the set of connected modules; forming an edge fiber coupling interface by exposing a portion of each optical fiber stub on the lateral side of the overmold body of the selected module, creating fiber optic couplings for optical coupling to external optical fibers; and forming a ball grid array (BGA) on the RDL interposer of the selected module, the BGA being electrically connected to the selected PIC die and the respective ancillary device by the RDL interposer, the BGA configured to electrically couple the selected PIC die and the respective ancillary device to a printed circuit board (PCB).

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 3 also shows an optical connector.

FIG. 4 shows an enlarged side view of a lateral side of a PIC fan-out package with optical fibers in place, according to embodiments of the disclosure.

FIG. 5 shows a side, top up perspective view of embodiments of a PIC fan-out package, according to another embodiment of the disclosure, but without a PCB attached thereto.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a photonic integrated circuit (PIC) fan-out package and related methods of forming the same. The PIC fan-out package includes a PIC die and an ancillary device(s) in an overmold body. A plurality of optical fiber stubs are operatively coupled to electro-optical circuitry including an optical waveguide system (including a waveguide for each fiber) in the PIC die. In contrast to conventional PIC packages, an edge fiber coupling interface is provided in a lateral side of the overmold body for coupling the plurality of optical fiber stubs to external optical fibers with a connector. A redistribution layer (RDL) interposer is adjacent the overmold body and electrically connects to the PIC die and the ancillary device(s). A ball grid array (BGA) electrically couples to the PIC die and the ancillary device by the RDL interposer. The BGA is configured to electrically couple the PIC die and the ancillary device(s) to a printed circuit board (PCB). The PIC fan-out package provides a simpler side coupling structure for external fiber optic links, and solder reflowable interconnects for electrical interconnection for PCB attachment. Since the optical fiber stub attachment is done at the reconstituted wafer level with known good dies (KGD), the fiber alignment can be a high throughput process compared to conventional PIC die packaging processes. Ancillary devices can include, for example, a trans-impedance amplifier (TIA), a driver and/or a passive device (e.g., resistors, capacitors, etc.). The ancillary device(s) are integrated in the package to provide higher packaging integration density. The back side of the PIC die and ancillary devices may be exposed in the overmold body so a heat spreader can be attached for thermal management. The BGA enables a solder reflowable optical module with exposed fiber ends after reflow to the PCB. External optical fibers can be coupled to the package using passive or active alignment (e.g., mechanical positioning and alignment versus use of optical and/or electrical feedback to determine optimal alignment) referencing to protruding optical fiber stubs, or can be coupled to a polished side of the PIC die. The PIC fan-out package may be applied across a variety of applications such as but not limited to short reach, low cost, high speed optical link applications (e.g., automotive, artificial intelligence (AI), cameras, harsh environments, military, augmented reality/virtual reality (AR/VR), etc.).

Figure 1:
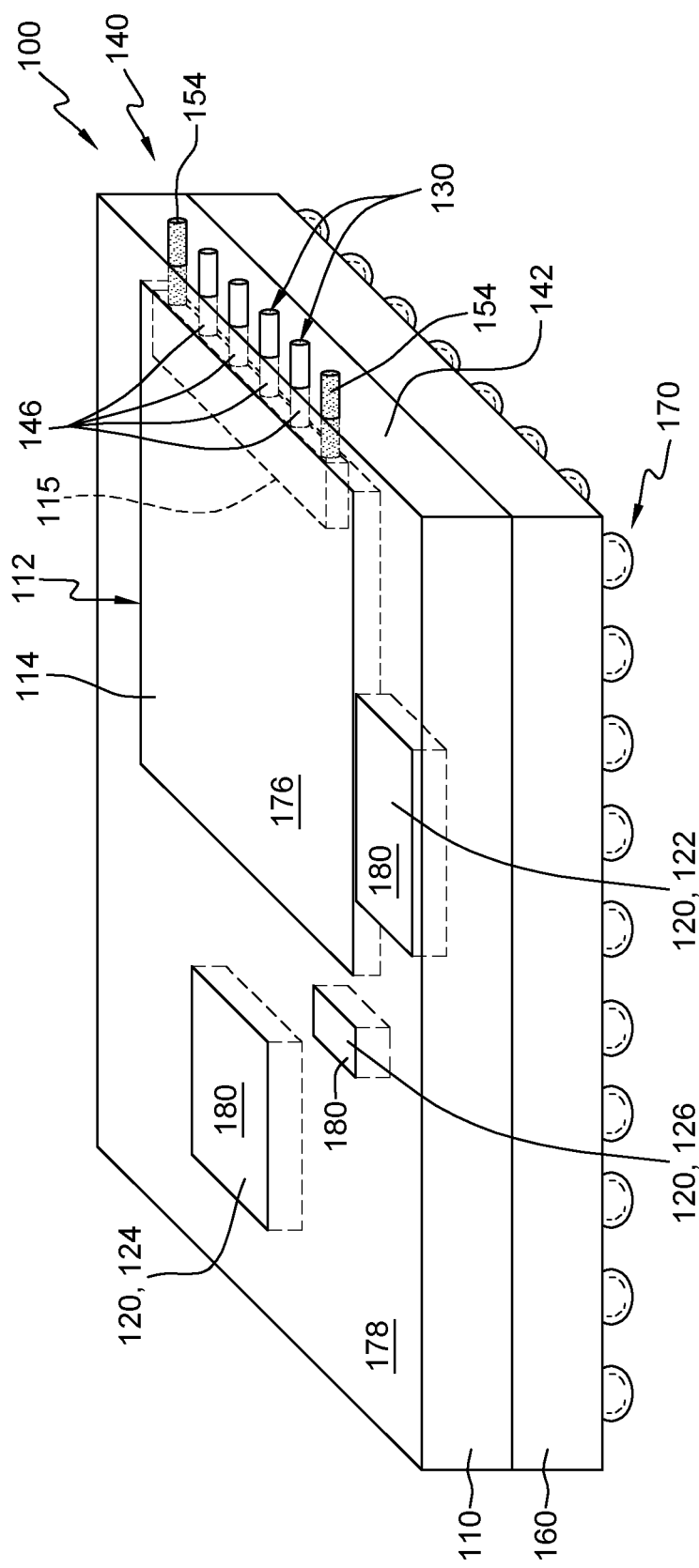
FIG. 1 shows a side, top up perspective view of embodiments of a PIC fan-out package, according to embodiments of the disclosure, but without a printed circuit board (PCB) attached thereto.
Figure 2:
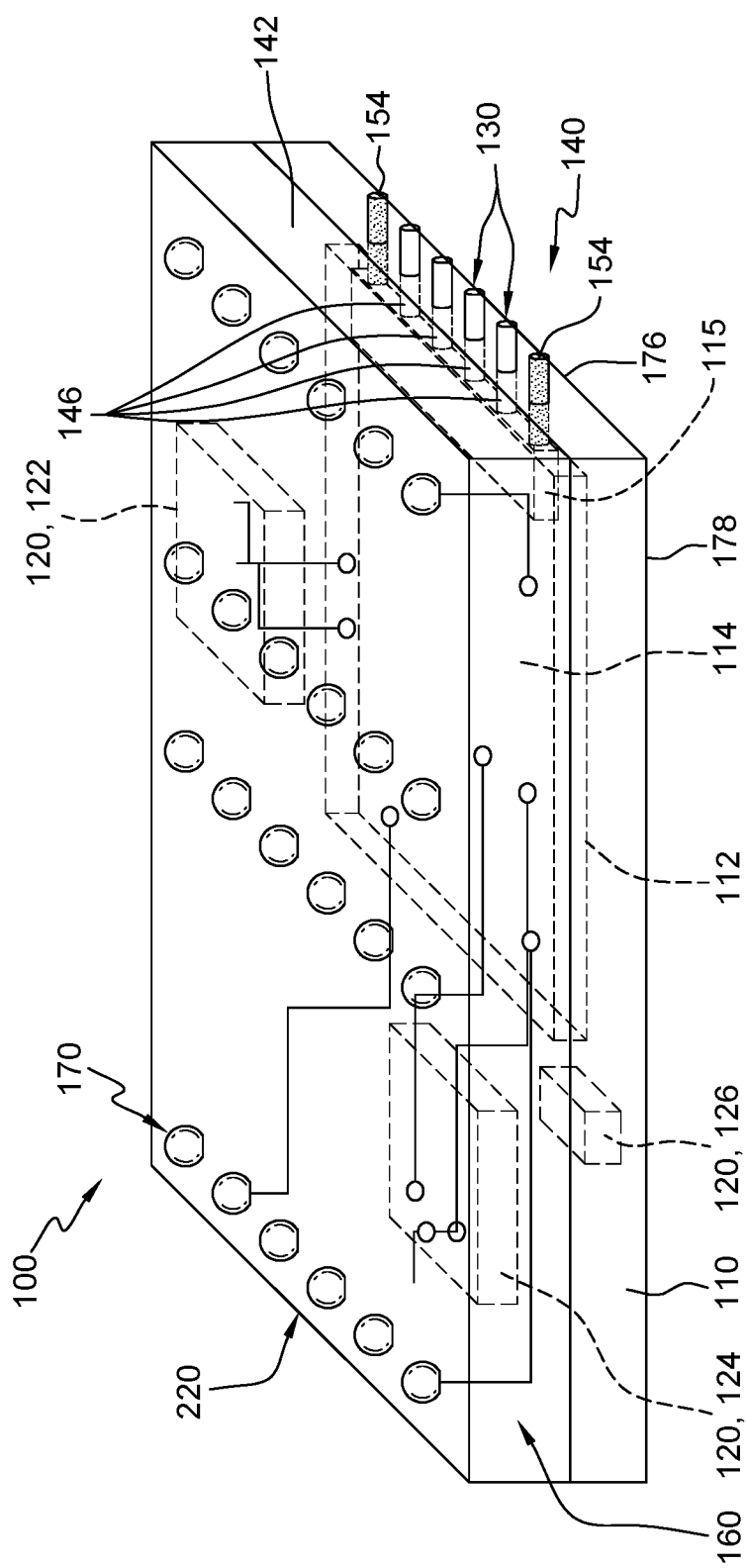
FIG. 2 shows a side, bottom up perspective view of embodiments of PIC fan-out package 100, according to embodiments of the disclosure, but without a PCB attached thereto.
Figure 3:
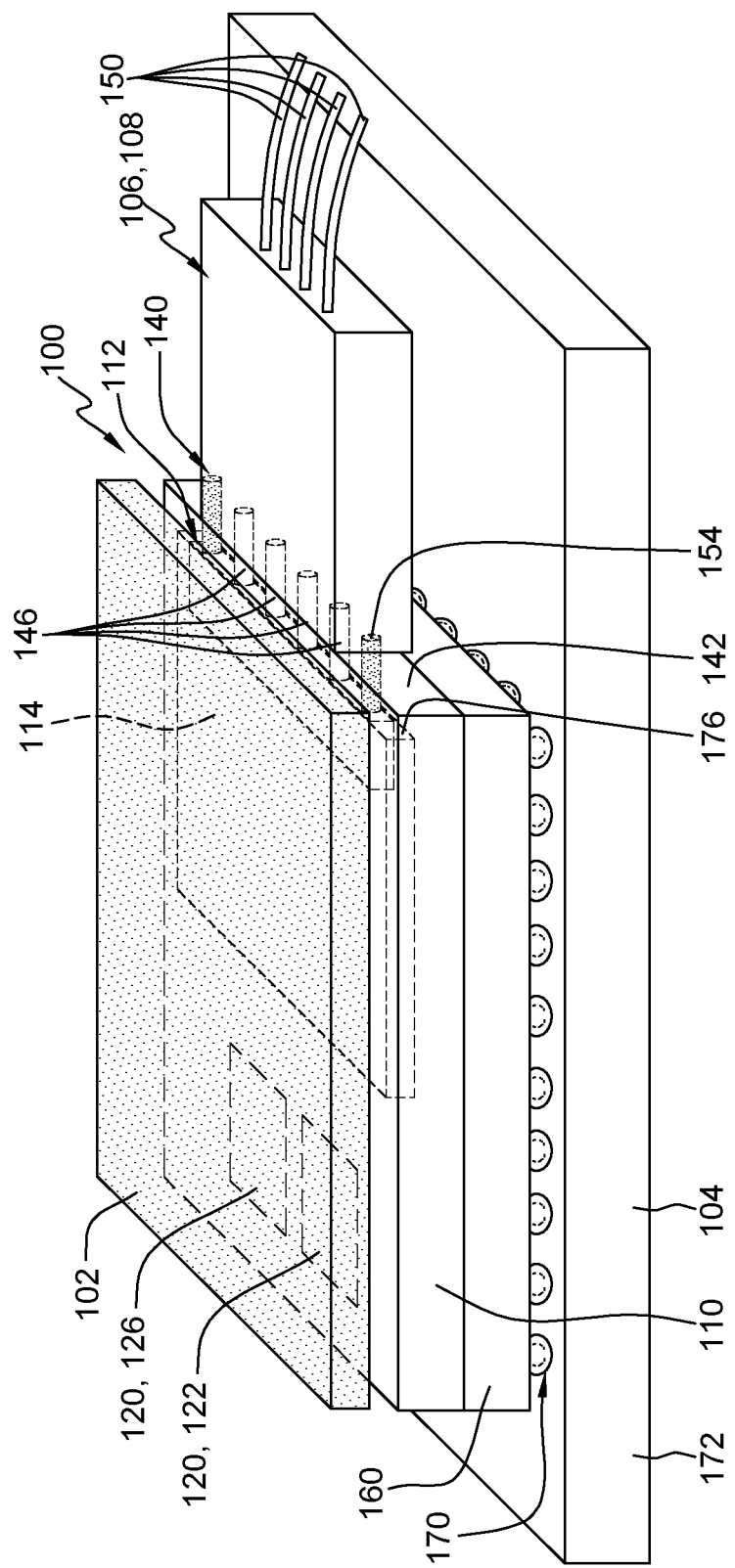
FIG. 3 shows a side, top up perspective view of embodiments of PIC fan-out package with a heat spreader and a PCB, according to embodiments of the disclosure.

Referring to FIGS. 1-3, FIG. 1 shows a side, top up perspective view of embodiments of a PIC fan-out package 100 without a PCB attached thereto; FIG. 2 shows a side, bottom up perspective view of embodiments of PIC fan-out package 100 without a PCB; and FIG. 3 shows a side, top up perspective view of embodiments of PIC fan-out package 100 with a heat spreader 102, a PCB 104 and an optical connector 106. With reference to FIGS. 1-2, embodiments of PIC fan-out package 100 (hereinafter "PIC package 100") may include an overmold body 110, and a PIC die 112 in overmold body 110. PIC die 112 may include any now known or later developed semiconductor photonic integrated circuit. As understood in the art, PIC die 112, also known as integrated optical circuits, can be any device that includes electro-optical circuitry 114 that integrates multiple photonic functions for optical information signals received thereby via, e.g., optical fibers. Such functions oftentimes includes converting the optical information signals to electrical signals or vice versa. Electro-optical circuitry 114 may include an optical waveguide system 115 (e.g., grating coupler or I/O waveguide), but may also include, depending on application, other components such as but not limited to: a Bragg reflector, an arrayed waveguide grating or other wave guide, transistor based electronics including detectors and modulators, amplifiers, and/or an externally modulated laser diode with an electro-absorption modulator. It is understood that optical waveguide system 115 may include structures to guide light/signals from each optical fiber coupled thereto, individually.

Overmold body 110 may include any now known or later developed material capable of encapsulating electronic devices such as but not limited to thermoset polymers that come in, for example, epoxy molded compounds resins, or silicone-based materials.

PIC package 100 may also include an ancillary device 120 in overmold body 110. Ancillary device(s) 120 may include any one or more devices providing complementary functions to PIC die 112. Any number of ancillary device(s) 120 may be provided. Ancillary device(s) 120 may include but are not limited to: a trans-impedance amplifier (TIA) 122, a driver 124 and a passive device 126 (e.g., a resistor, capacitor or other passive element).

As shown best in an enlarged side view in FIG. 4, PIC package 100 also includes plurality of optical fiber stubs 130 operatively coupled to optical waveguide system 115 (FIG. 1, in phantom). Optical fiber stubs 130 can be coupled to optical waveguide system 115 via a plurality of V-groove receptacles 132 (buried in overmold 110, shown in phantom). As understood in the art, V-groove receptacles 132 act to position optical fiber stubs 130 relative to, for example, optical waveguide system 115 of electro-optical circuitry 114 (FIGS. 1-3). Optical fiber stubs 130 may include any now known or later developed single mode or multi-mode glass fiber. Optical fiber stubs 130 are referred to as 'stubs' because of their relatively short length. Optical fiber stubs 130 may be, for example, 1200-1300 micrometers (μm) in length, with approximately 100-200 μm protruding from a lateral side 142 of PIC die 112. Further, each optical fiber stub 130 may have, for example, a 9 μm core and a 125 μm outer diameter glass cladding. It is noted that these dimensions are typical dimensions of optical fiber stubs 130 assuming a PIC die 112 with 1 mm long V-groove receptacles 132. It is emphasized that dimensions may vary depending on, for example, the die size, V-groove receptacle 132 length, the fiber stub length and/or stub protruding length. Optical fiber stubs 130 with 80 micrometer (μm) diameter and with a 4 μm core are also possible. Multimode fibers (125 μm fiber with 62.5 μm core) could also be coupled to the V-groove receptacles. Optical fiber stubs 130 may be held in V-groove receptacle 132 by an adhesive 136, discussed in greater detail herein. Fiber optic stubs 130 extend from a lateral side of PIC die 112 towards a lateral side of overmold body 110.

In contrast to conventional PIC die packages, PIC package 100 includes an edge fiber coupling interface 140 in lateral side 142 of overmold body 110 for coupling plurality of optical fiber stubs 130 to external optical fibers 150 using a connector. "Lateral side" indicates a side of the square shaped overmold body (or PIC die) that is not vertically facing, i.e., up or down, in an operative state. In one embodiment, shown in FIGS. 1-3, edge fiber coupling interface 140 includes each of optical fiber stubs 130 extending from the lateral side of PIC die 112 and protruding from lateral side 142 of overmold body 110. In this case, optical fiber stubs 130 have a protrusion 146 extending externally of lateral side 142, e.g., 100-200 μm. While four (4) protrusions 146 are shown in FIGS. 1-3, any number can be used. Each optical fiber stub 130, via protrusions 146, are configured to optically couple to external optical fibers 150 (FIG. 3) using, for example, optical connector 106 in the form of an external optical connector 108 (FIG. 3). External optical connector 106 may include any now known or later developed optical fiber connection mechanism such as but not limited to a precision aligned pluggable socket terminating in additional fibers or pigtails. As an option, edge fiber coupling interface 140 may further include an alignment member 154 for aligning external optical connector 106 with protrusions 146 of plurality of optical fiber stubs 130 protruding from lateral side 142 of overmold body 110. Alignment member 154 may include, for example, one or more protruding pins that are complementary to matching receptacles (not shown) in external optical connector. Two pins are shown, but any number may be provided. Alignment member 154 may be made of any rigid material such as metal or hard plastic. Any other structure necessary to hold external optical connector 106 to overmold body 110 may be employed such as but not limited to: snap fasteners, threaded fasteners, etc.

In another embodiment, shown in FIG. 5, edge fiber coupling interface 140 may include optical fiber stubs 130 (FIG. 4) being flush 148 to lateral side 142 of overmold body 110 for optical coupling to external optical fibers 150 using external optical fiber shunts 152. After dicing to singulate, lateral side 142 of overmold body 110 is polished so that optical fiber ends are flush with lateral side of overmold body 110 of PIC package 100. An optical connector 106 with optical fiber shunts 152 (e.g., an array of optical fibers in a glass v-groove assembly) can be actively aligned to the lateral side of PIC package 100.

Any structure necessary to hold external optical connector 106 to overmold body 110 may be employed such as but not limited to: snap fasteners, threaded fasteners, etc. FIG. 5 also shows an optional embodiment in which a laser die 156 is within or part of PIC die 112. In this fashion, PIC die 112 is not reliant on an external light source, as is typically the case.

PIC package 100, as shown best in FIG. 3, also may include a redistribution wiring layer (RDL) interposer 160 adjacent overmold body 110 and electrically connected to PIC die 112 and ancillary device(s) 120. RDL interposer 160 may include any now known or later developed interconnect structure such as but not limited to wiring and vias within respective dielectric layers. Dielectric layers may include but are not limited to: polyimide (PI), polybenzaoxazole (PBO), benzocyclobutene (BCB), and epoxy based materials. Wiring and vias may include any now known or later developed materials such as copper or aluminum within a refractory metal liner. In contrast to many conventional PIC packages, ancillary device(s) 120 and PIC die 112 may have coplanar surfaces at a location where each meet RDL interposer 160. That is, ancillary device(s) 120 and PIC die 112 have the same connection plane with RDL interposer 160.

PIC package 100 may also include a ball grid array (BGA) 170 electrically coupled to the PIC die 112 and ancillary device(s) 120 by RDL interposer 160. As shown in FIG. 3, BGA 170 is configured to electrically couple PIC die 112 and ancillary device(s) 120 to a printed circuit board (PCB) 172. BGA 170 may include any now known or later ball grid array, e.g., of tin solder bumps arrayed to electrically couple connectors of RDL interposer 160 to PCB 172 in a conventional fashion. RDL interposer 160 may interconnect PIC die 112 and/or ancillary device(s) 120 to one another or to BGA 170 in any desired manner.

As shown in FIG. 1, in one embodiment, a surface 176 of PIC die 112 is exposed in an upper surface 178 of overmold body 110. In this fashion, as shown in FIG. 3, heat spreader 102 may be thermally coupled to PIC die 112. Further, as shown in FIG. 1, a surface 180 of one or more of ancillary device(s) 120 may also be exposed in upper surface 178 of overmold body 110. As shown in FIG. 3, heat spreader 102 may be thermally coupled to at least one of ancillary device(s) 120, e.g., trans-impedance amplifier (TIA) 122, driver 124 and passive device(s) 126. Heat spreader 102 may take any now known or later developed form of heat dissipating device, e.g., nickel plated copper lid, a finned aluminum plate, a liquid or air cooled member, thermo-electric cooling (TEC) system, etc. Heat spreader 102 may be adhered to upper surface 178 of overmold body 110 and/or upper surface(s) 176, 180 of PIC die 112 and ancillary device(s) 120, respectively, using any now known or later developed thermal interface material.

Figure 6:
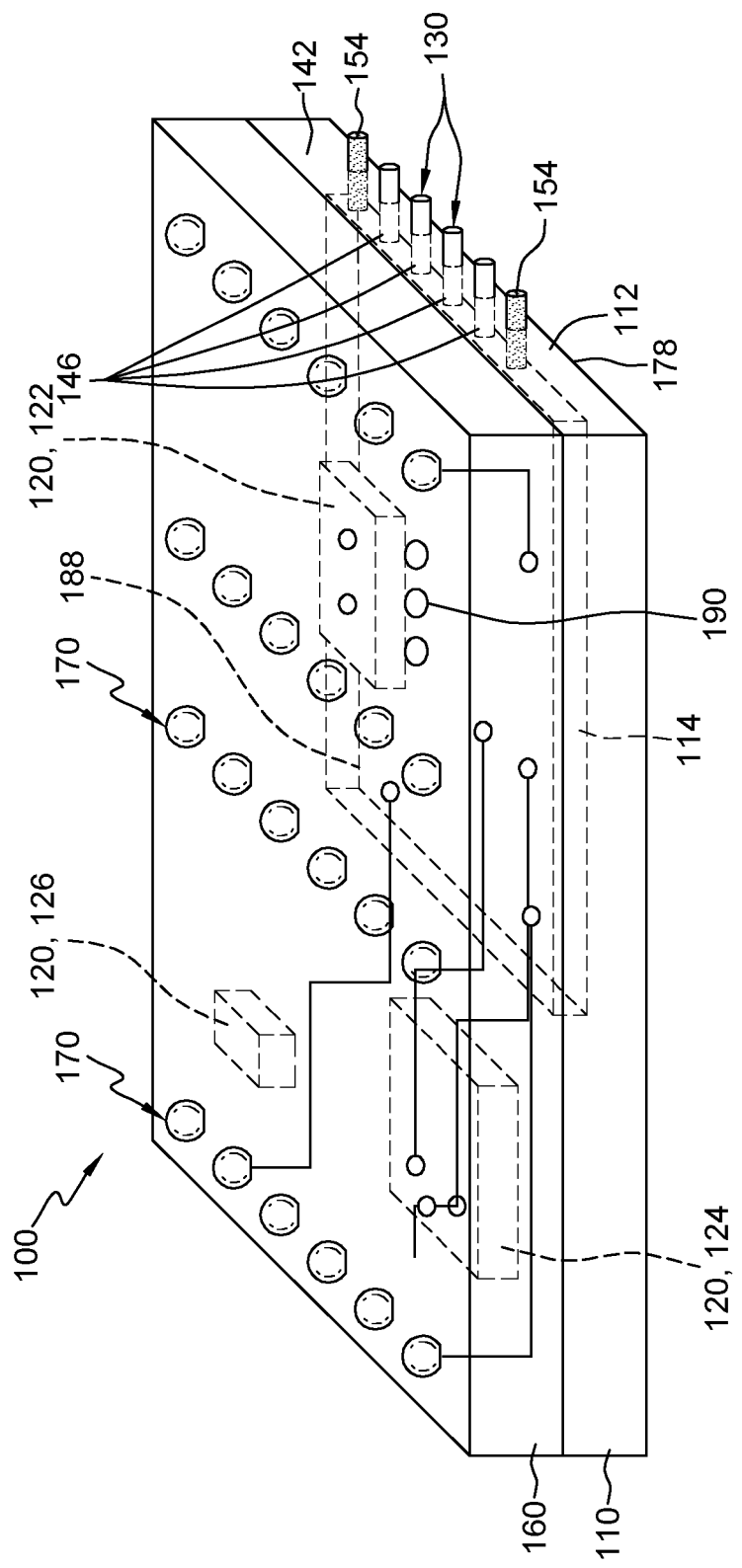
FIG. 6 shows a side, bottom up perspective view of embodiments of PIC fan-out package, according to another embodiment of the disclosure, but without a printed circuit board attached thereto.

FIG. 6 shows a side, bottom up perspective view of embodiments of PIC package 100 without PCB 172 (FIG. 3), including other optional embodiments. As shown in FIG. 6, in one embodiment, TIA 122 may be flip-chip coupled to PIC die 112. That is, TIA 122 may be directly coupled to a vertically facing (bottom) surface 188 of PIC die 112, e.g., via a controlled collapse chip connects (C4) 190.

Figure 7:
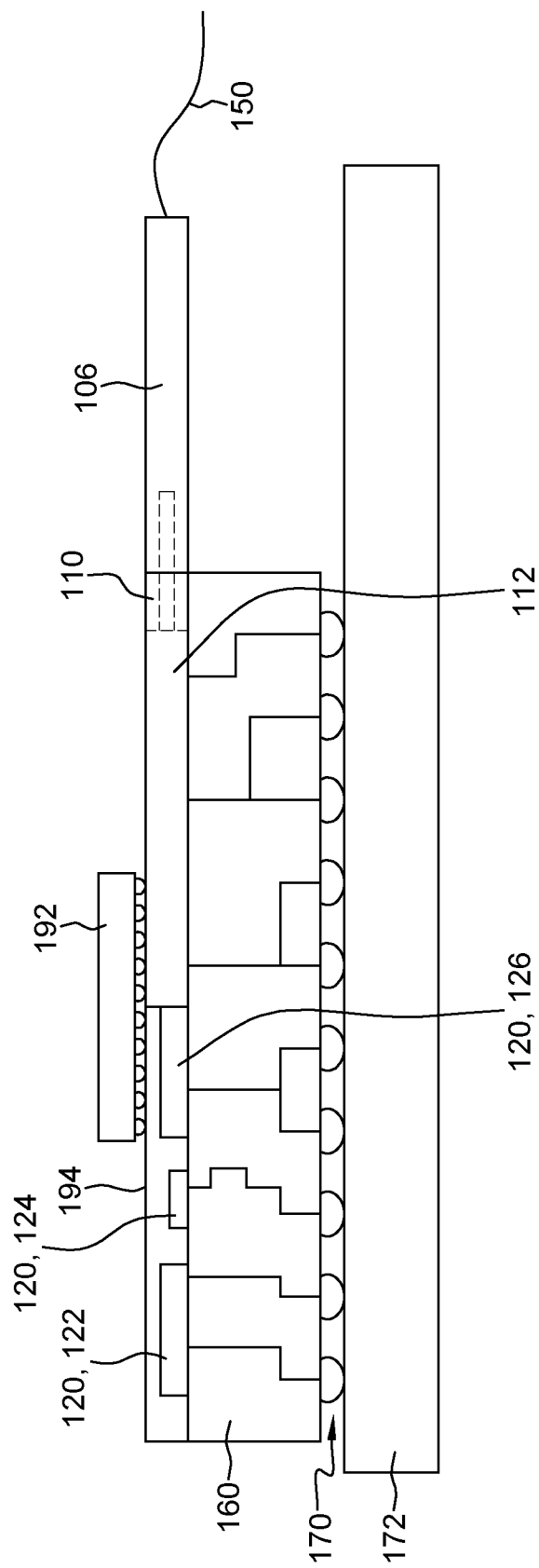
FIG. 7 shows a side, cross-sectional view of embodiments of PIC fan-out package, according to another embodiment of the disclosure.

FIG. 7 shows a cross-sectional side view of PIC package 100 according to another optional embodiment that includes another device 192 mounted to an exterior surface 194 of overmold body 110. Device 192 may include any now known or later developed device that may be desired to operatively couple to PIC die 112 and/or ancillary device(s) 120 such as but not limited to: another IC, passive devices, etc.

PIC package 100 can be made in a number of ways. FIGS. 8, 9A, 9B and 10-14 show one embodiment of a method of making PIC package 100 in which circuitry, e.g., of PIC die 112 is facing up during manufacture, and FIGS. 15-22 show another embodiment of a method of making PIC package 100 in which circuitry is facing down during manufacture. Each method creates PIC package 100, as described herein.

Figure 8:
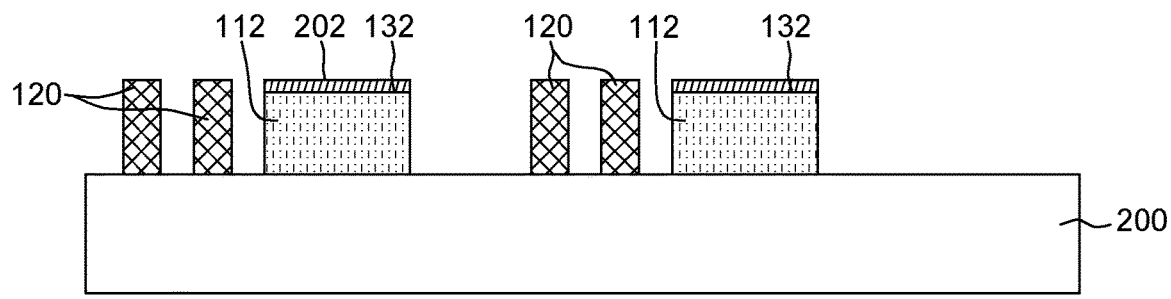
FIGS. 8, 9A, 9B and 10-14 show steps of a method of making a PIC fan-out package according to one embodiment of the disclosure.
Figure 9A:
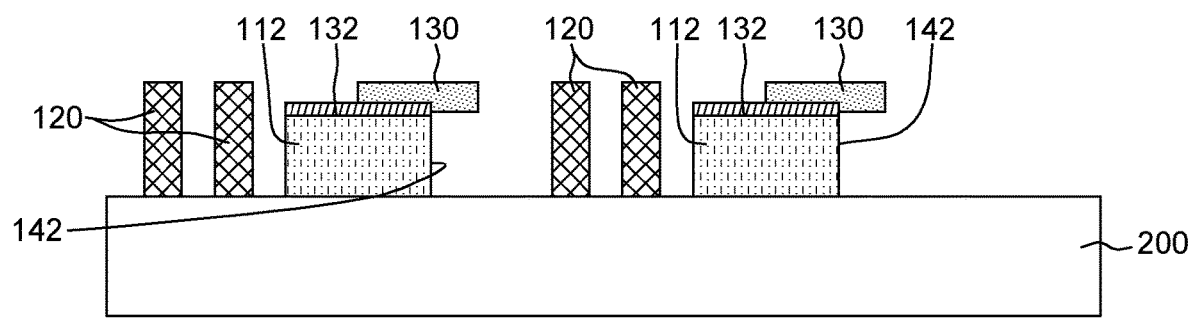
Figure 9B:
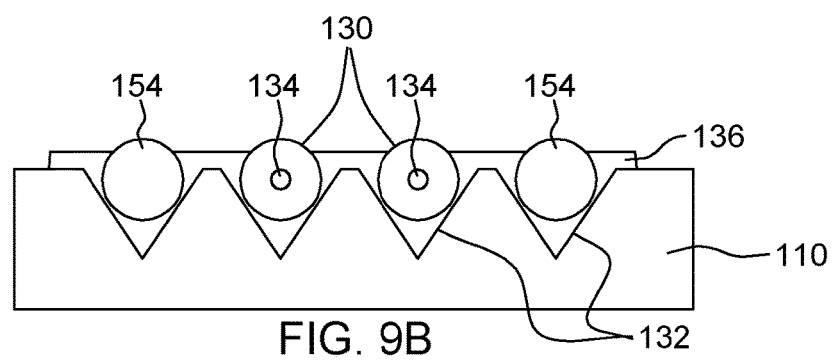

Referring to FIG. 8, according to a first step of an embodiment of a method of making PIC package 100, a plurality of sets of a PIC die 112 and ancillary device(s) 120 are mounted to a carrier 200. Each PIC die 112 and ancillary device(s) 120 are known good devices (KGDs), i.e., compared to inoperative devices. Each PIC die 112 and each ancillary device 120 have electrical connection points 202 on an opposing, vertically facing side thereof from carrier 200, i.e., circuitry for each is facing upwardly or oppositely of carrier 200. Further, each PIC die 112 includes a plurality of V-groove fiber optic receptacles 132 (see FIG. 4), each configured to receive and operatively couple an optical fiber stub 130 (FIGS. 9A and 9B) to the respective PIC die 112, e.g., at least two of the plurality of V-groove fiber optic receptacles 132 receive an optical fiber stub 130 (FIGS. 9A and 9B). PIC die 112 and ancillary device(s) 120 may be mounted to carrier 200 using any now known or later developed material, e.g., an adhesive. Carrier 200 may include any now known or later developed wafer handling material, e.g., glass or silicon.

FIG. 9A shows a side view of and FIG. 9B shows an enlarged end view of individually mounting an optical fiber stub 130 into each of the desired (e.g., least two) of V-groove receptacles 132, each optical fiber stub 130 protruding from lateral side 142 of respective PIC die 112. As noted, V-groove receptacles 132 act to position optical fiber stubs 130 relative to, for example, a waveguide (not shown) in PIC die circuitry 114 (FIG. 1). As also noted, optical fiber stubs 130 may include any now known or later developed single mode or multi-mode glass fiber. As noted, optical fiber stubs 130 are referred to as 'stubs' because of their relatively short length. Optical fiber stubs 130 may include any of the previously described fibers, for example, those that are 1200-1300 μm in length, and may protrude, for example, 100-200 μm from lateral side 142. This step may include any now known or later developed pick and place process known in the art. For example, each optical fiber stub 130 may picked and placed into a respective V-groove receptacle 132, followed by applying adhesive 136 (FIG. 9B) to each optical fiber stub 130, and curing the adhesive, e.g., using light and/or heat. As shown in FIG. 9B, optical fiber stubs 130 may be held in V-groove receptacle 132 by adhesive 136, which may include, for example, a light or thermal curable adhesive. At this time, the method may also include mounting alignment member 154 (FIGS. 3, 4 and 9B), e.g., metal pins, in at least one of plurality of V-groove receptacles 132 and adhering them in place.

Figure 10:
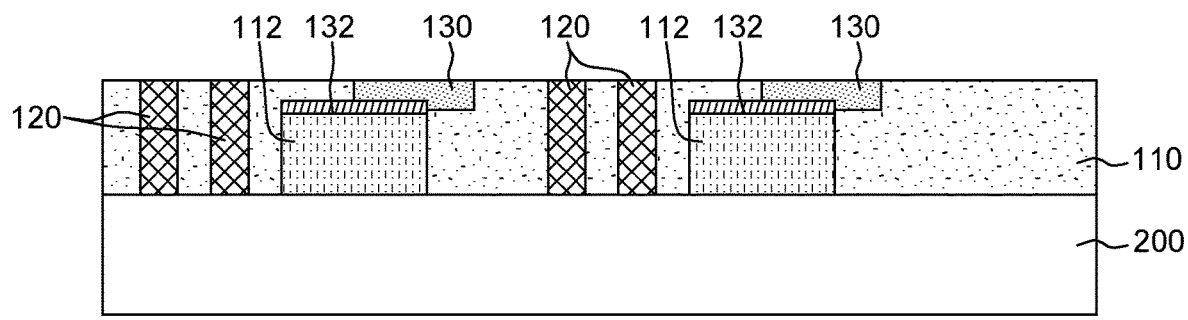

FIG. 10 shows overmolding of plurality of sets of PIC die 112 and ancillary device(s) 120 on carrier 200, creating overmold body 110. As noted, overmold body 110 may include any now known or later developed material capable of encapsulating electronic devices such as but not limited to thermoset polymers that come in, for example, epoxy molded compounds resins, or silicone-based materials.

Figure 11:
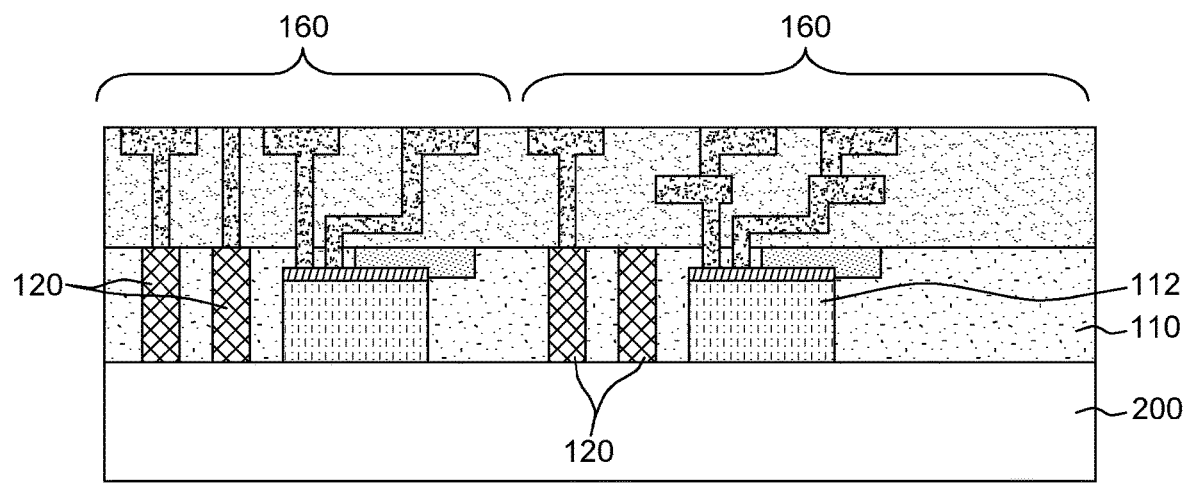
Figure 12:
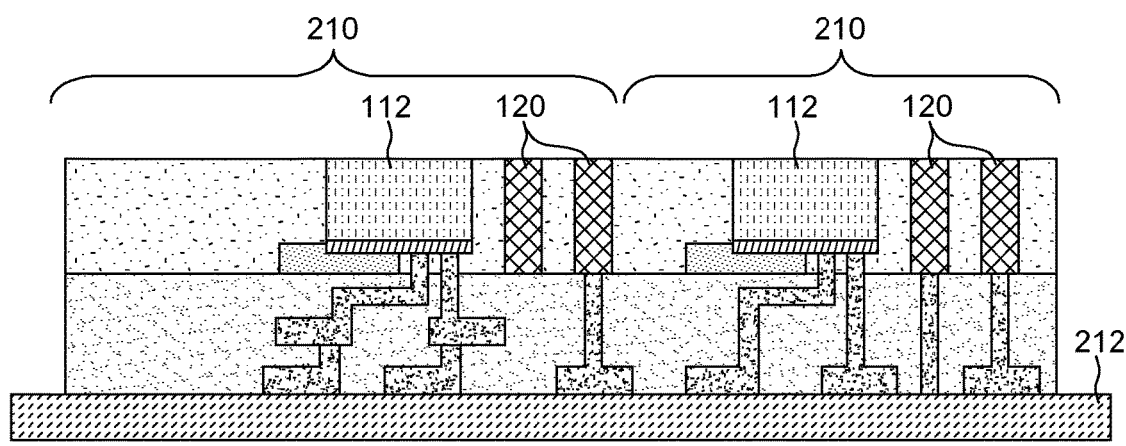

FIG. 11 shows forming RDL interposer 160 for each of the plurality of sets. Each RDL interposer 160 electrically connects to at least one of the PIC die 112 and ancillary device(s) 120. RDL interposer 160 may be formed using any now known or later developed semiconductor wiring/via formation techniques such as damascene or dual damascene techniques. FIG. 12 shows removing carrier 200, creating a set of connected modules 210, each module 210 including a selected PIC die 112 and a selected ancillary device(s) 120, i.e., to form a desired PIC package 100. FIG. 12 shows a dicing frame 212 supporting set of connected modules 210.

Figure 13:
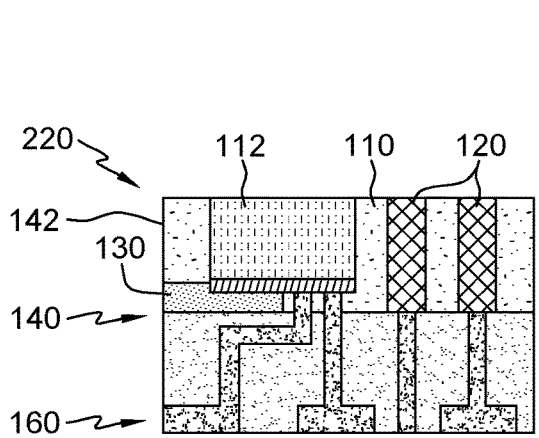
Figure 14:
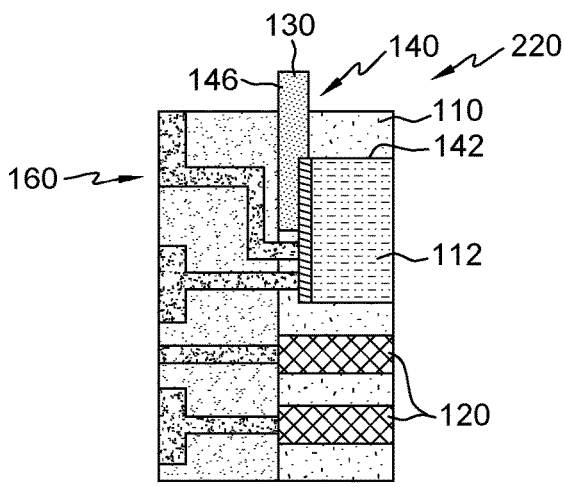

FIG. 13 shows dicing a selected module 220 from the set of modules shown in FIG. 12. The dicing may include using any now known or later developed dicing technique, e.g., lasers, to separate the modules. FIG. 13 also shows forming an edge fiber coupling interface 140 according to the embodiment in which optical fiber stubs 130 are flush with lateral side 142 of overmold body 110 of selected module 220, as in FIG. 5. This step may include performing a planarization of lateral side 142 (after rough cut from dicing) to planarize (and make flush) and polish the ends of each optical fiber stub 130 on lateral side 142 of overmold body 110 of selected module 220. FIG. 14 shows forming an edge fiber coupling interface 140 by exposing a portion (e.g., protrusion 146) of each optical fiber stub 130 on lateral side 142 of overmold body 110 of selected module 220, as in FIG. 3. This step may also include exposing a portion of each alignment member 154 (FIGS. 3 and 4) on lateral side 142 of overmold body 110. Thus, each alignment member 154 protrudes from lateral side 142 of overmold body 110. This step may include planarizing lateral end 142 of overmold body 110 (after rough cut from dicing) to planarize each optical fiber stub 130 on lateral side 142 of overmold body 110 of selected module 220, and etching overmold body 110 to expose the portion of each optical fiber stub 130 on the lateral side of the overmold body of the selected module.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the module. Since neutral particles attack the side of the module from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE may be carried out.

Returning to FIG. 2, the drawing shows a final step of forming BGA 170 on RDL interposer 160 of selected module 220. As noted, BGA 170 is electrically connected to PIC die 112 and ancillary device(s) 120 by RDL interposer 160. BGA 170 is configured to electrically couple PIC die 112 and ancillary device(s) 120 to PCB, as shown in FIG. 3.

Referring to FIGS. 15-22, another embodiment of a method of making PIC package 100 is shown. Here, as will be described, optical fiber stubs 130 are connected to PIC die 112 prior to packaging with ancillary device(s) 120. As a result, circuitry of PIC die 112 and ancillary device(s) 120 can be facing downwardly during manufacture. As will be described, each PIC die 112 and each ancillary device 120 have electrical connection points 202 (in a circuit plane 203, FIGS. 17 and 20) against a carrier 250 (FIG. 17), i.e., circuitry for each is facing carrier 250.

Figure 15:
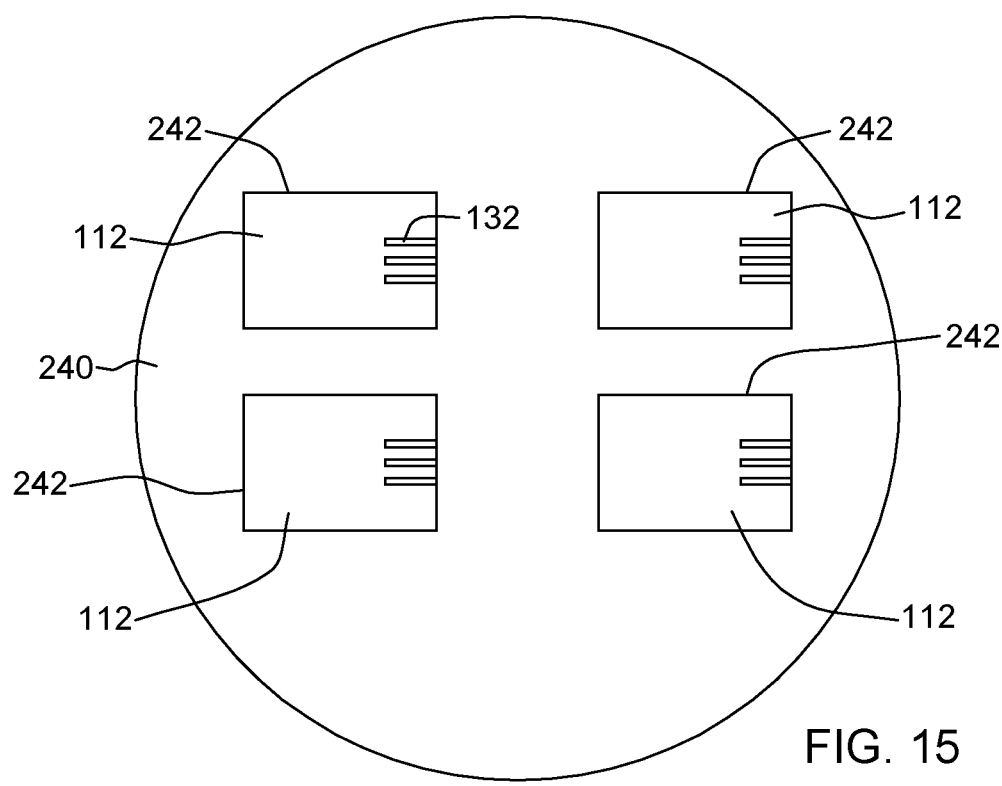
FIGS. 15-22 show steps of a method of making a PIC fan-out package according to another embodiment of the disclosure.
Figure 16:
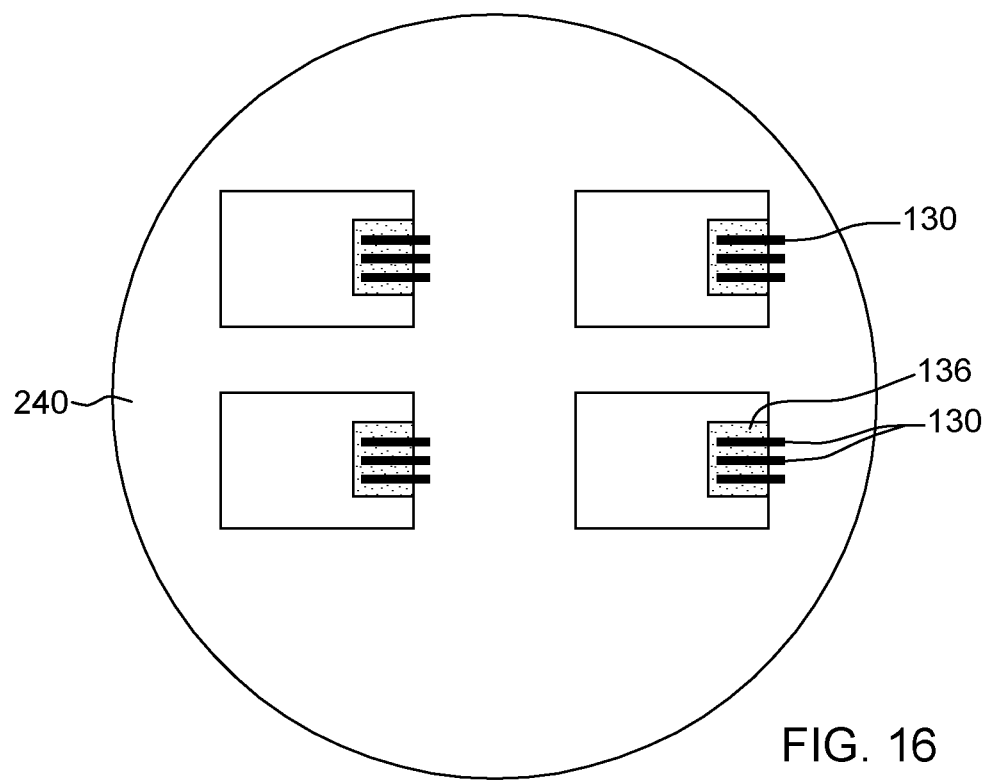

FIG. 15 shows mounting PIC dies 112 to a first carrier 240, each PIC die 112 includes a plurality of V-groove receptacles 132 on an opposing vertically facing side 242 of respective PIC die 112 from first carrier 240. First carrier 240 may include any now known or later developed wafer handling material, e.g., glass or silicon. Each PIC die 112 employed represents a known good die (KGD), i.e., compared to discarded, inoperative dies. PIC dies 112 may be mounted using any now known or later developed process, e.g., adhesive. Each V-groove receptacle 132 is configured to receive and operatively couple optical fiber stub 130 (FIG. 16) to the respective PIC die. FIG. 16 shows individually mounting optical fiber stubs 130 into each of the at least two of plurality of V-groove receptacles 132 (FIG. 4). This step may include any now known or later developed pick and place process known in the art. For example, each optical fiber stub 130 may be picked and placed into a respective V-groove receptacle 132 (FIG. 4), followed by applying adhesive 136 (FIG. 4) to each optical fiber stub 130, and curing the adhesive, e.g., using light or heat. At this time, the method may also including mounting alignment member 154 (FIGS. 3 and 4), e.g., metal pins, in at least one of plurality of V-grooves 132 (FIG. 4) and adhering them in place. A circuit plane 203 (FIG. 17) may be added at this stage to provide electrical connection points 202 (FIG. 17).

Figure 17:
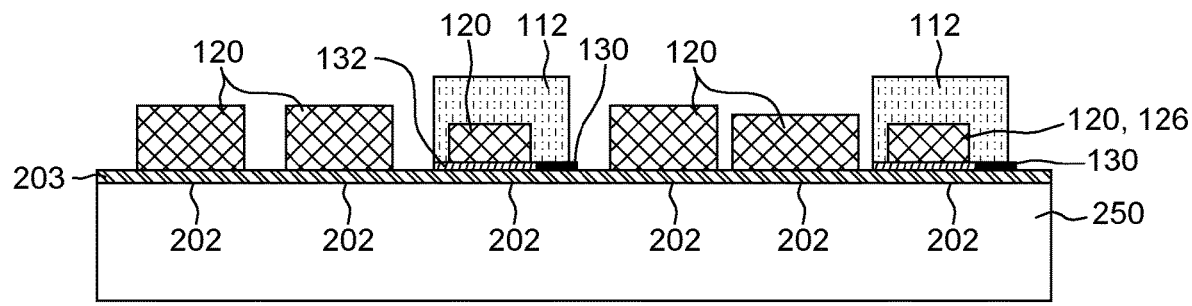

FIG. 17 shows PIC dies 112 after separating each PIC die 112 from first carrier 240 (FIG. 16), e.g., using dicing or adhesive removal techniques and with circuit plane 203, and mounting a plurality of sets of a selected PIC die 112 (e.g., known good die) and an ancillary device(s) 120 to a second carrier 250. Second carrier 250 may include any now known or later developed wafer handling material, e.g., glass or silicon. Here, plurality of V-groove receptacles 132 and optical fiber stubs 130, and other circuitry on PIC die 112 and ancillary device(s) 120, are adhered to second carrier 250, facing (downwardly) carrier 250. As a result, the circuitry of each part is coplanar. Second carrier 250 may include any material listed herein for first carrier 240.

Figure 18:
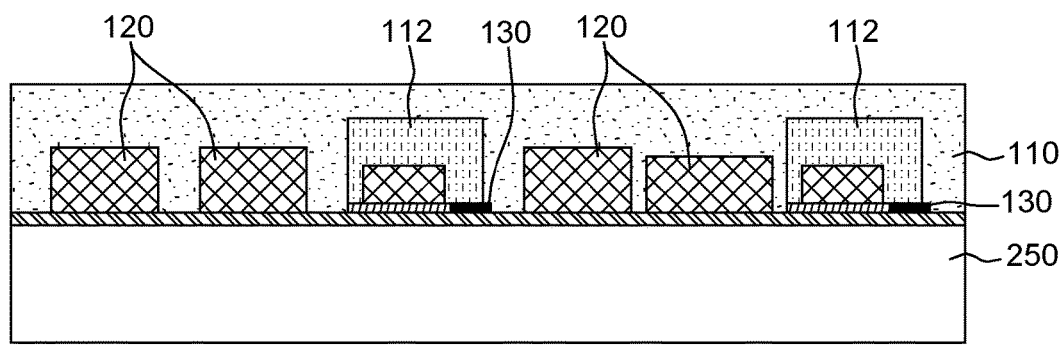

FIG. 18 shows overmolding of plurality of sets, i.e., of PIC die 112 and ancillary device(s) 120, on second carrier 250, creating overmold body 110. As noted, overmold body 110 may include any now known or later developed material capable of encapsulating electronic devices such as but not limited to thermoset polymers that come in, for example, epoxy molded compounds resins, or silicone-based materials.

Figure 19:
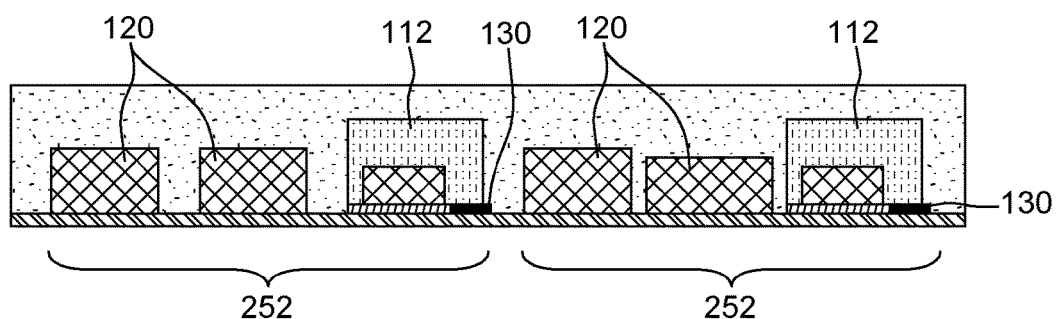

FIG. 19 shows removing second carrier 250, creating a set of connected modules 252. Second carrier 250 may be removed in any known fashion. Each module 252 includes a selected PIC die 112 and a respective ancillary device(s) 120, i.e., to form a desired PIC package 100.

Figure 20:
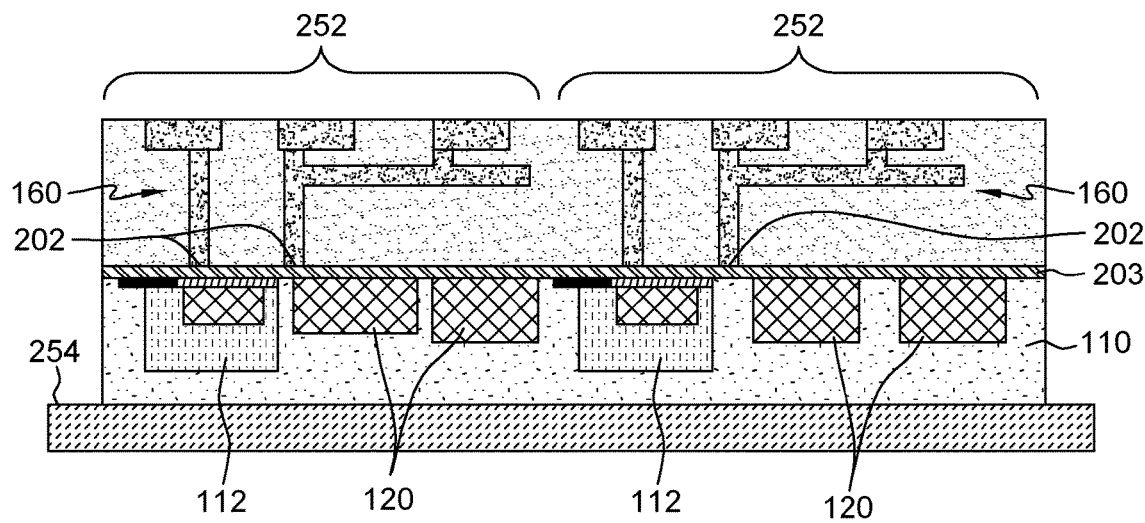

FIG. 20 shows, after flipping overmold body 110, forming RDL interposer 160 for each connected module 252. Each RDL interposer 160 electrically connects to the selected PIC die 112 and the respective ancillary device(s) 120 of a respective connected module 252. Each RDL interposer 160 electrically connects to at least one of PIC die 112 and ancillary device(s) 120. RDL interposer 160 may be formed using any now known or later developed semiconductor wiring/via formation techniques such as photolithographic via formation or laser via ablation and plating. FIG. 20 also shows a dicing frame 254 supporting set of connected modules 252.

Figure 21:
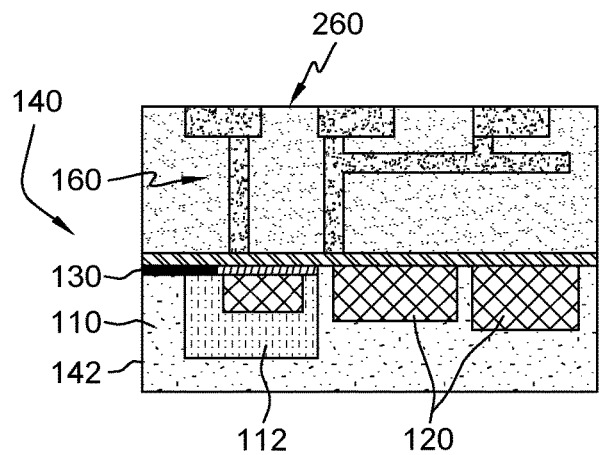
Figure 22:
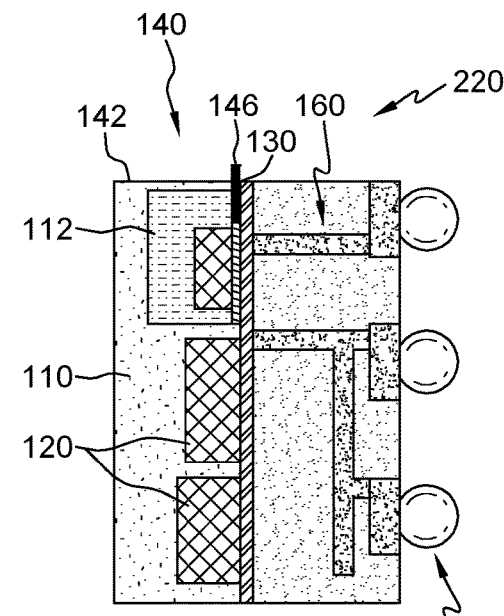

FIG. 21 shows dicing to create a selected module 260 from the set of connected modules 252 shown in FIG. 20. The dicing may include using any now known or later developed dicing technique, e.g., saw dicing, lasers, to separate the modules. FIG. 21 shows forming an edge fiber coupling interface 140 according to the embodiment in which optical fiber stubs 130 are flush on lateral side 142 of overmold body 110 of selected module 220, as in FIG. 5. This step may include planarizing lateral side 142 (after dicing). FIG. 22 shows forming an edge fiber coupling interface 140 by exposing a portion (e.g., protrusion 146) of each optical fiber stub 130 on the lateral side 142 of overmold body 110 of selected module 220, as in FIG. 3. This step may also include exposing a portion of each alignment member 154 (FIGS. 3 and 4) on lateral side 142 of overmold body 110. Thus, each alignment member 154 protrudes from lateral side 142 of overmold body 110. This step may include planarizing lateral end 142 of overmold body 110 (after rough cut from dicing) to planarize each optical fiber stub 130 on lateral side 142 of overmold body 110 of selected module 220, and etching overmold body 110 to expose the portion of each optical fiber stub 130 on the lateral side of the overmold body of the selected module. Each alignment member 154 (FIG. 3) may also be exposed at this time.

FIG. 22 (and FIG. 2) shows a final step of forming BGA 170 on RDL interposer 160 of selected module 260. As noted, BGA 170 is electrically connected to PIC die 112 and ancillary device(s) 120 by RDL interposer 160. BGA 170 is configured to electrically couple PIC die 112 and ancillary device(s) 120 to PCB, as shown, for example, in FIG. 3.

PIC package 100 as described herein may also include additional features such as flip chip die attachment of ancillary device(s) 120 to PIC die 112 (FIG. 7) for reducing die to die interconnect length (pre/post BGA formation). Further, as described relative to FIG. 5, PIC die 112 may also include a laser die 156 is within or part of PIC die 112. In this fashion, PIC die 112 is not reliant on an external light source, as is typically the case. Other enhancements of PIC package, i.e., as a wafer level fan out package, may include but are not limited to: thru-mold vias, integrated passives (ancillary device(s) 126 (FIG. 1)), package on package stacking (FIG. 7), electro-magnetic interference (EMI) shielding structures, thermal enhancements (e.g., heat spreader 102).

As noted, PIC fan-out package 100 provides a simpler side coupling structure for external fiber optic links 150, and solder reflowable interconnects for electrical interconnection for PCB (e.g., PCB 172 FIG. 7) attach via BGA 170. Ancillary devices 120 can include, for example, a transimpedance amplifier (TIA), driver and/or a passive device (e.g., resistors, capacitors, etc.). Ancillary device(s) 120 are integrated in the package to provide higher packaging integration density. A back vertically facing side of PIC die 112 and ancillary device(s) 120 may be exposed in overmold body 110 (e.g., surface 178 of overmold body 110 in FIG. 3) so heat spreader 102 can be attached for thermal management. BGA 170 creates a solder reflowable optical package with external fiber 150 attach after reflow. External optical fibers 150 can be coupled to the package using passive or active alignment referencing to protruding 146 optical fiber stubs 130, or can be coupled to a polished side 148 (FIG. 5) of PIC die 112. PIC package 100 may be applied across a variety of applications such as but not limited to short reach, low cost, high speed optical link applications (e.g., automotive, artificial intelligence (AI), cameras, harsh environments, military, augmented or virtual reality (AR/VR), etc.).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) fan-out package, comprising:
   an overmold body;
   a PIC die in the overmold body, the PIC die including electro-optical circuitry having an optical waveguide system, wherein a surface of the PIC die is exposed in an upper surface of the overmold body;
   a heat spreader thermally coupled to the exposed surface of the PIC die;
   a plurality of optical fiber stubs operatively coupled to the optical waveguide system and extending from a lateral side of the PIC die through a portion of the overmold body;
   an edge fiber coupling interface in a lateral side of the overmold body for coupling the plurality of optical fiber stubs to external optical fibers using a connector;
   an ancillary device in the overmold body;
   a redistribution wiring layer (RDL) interposer adjacent the overmold body and electrically connected to the PIC die and the ancillary device; and
   a ball grid array (BGA) electrically coupled to the PIC die and the ancillary device by the RDL interposer, the BGA configured to electrically couple the PIC die and the ancillary device to a printed circuit board (PCB).

2. The PIC fan-out package of claim 1, wherein each of the plurality of optical fiber stubs protrude from the lateral side of the overmold die, wherein the plurality of optical fiber stubs are configured to optically couple to the external optical fibers using the connector, the connector including an external optical connector external to the overmold body.

3. The PIC fan-out package of claim 2, wherein the edge fiber coupling interface further includes an alignment member for aligning the external optical connector with the plurality of optical fiber stubs protruding from the lateral side of the overmold body.

4. The PIC fan-out package of claim 1, wherein the edge fiber coupling interface includes the plurality of optical fiber stubs being flush to the lateral side of the overmold body for optical coupling to the external optical fibers using the connector, the connector including external optical fiber shunts.

5. The PIC fan-out package of claim 1, wherein the ancillary device includes at least one of: a trans-impedance amplifier (TIA), a driver and a passive device.

6. The PIC fan-out package of claim 5, wherein a surface of the ancillary device is exposed in an upper surface of the overmold body, further comprising a heat spreader thermally coupled to the at least one of the TIA, the driver and the passive device.

7. The PIC fan-out package of claim 5, wherein the TIA is flip-chip coupled to the PIC die.

8. The PIC fan-out package of claim 1, wherein the ancillary device and the PIC die have coplanar surfaces at a location where each meets the RDL interposer.

9. The PIC fan-out package of claim 1, further comprising a laser die within the PIC die.

10. The PIC fan-out package of claim 1, further comprising another device mounted to an exterior surface of the overmold body.

11. A photonic integrated circuit (PIC) fan-out package, comprising:
    an overmold body;
    a PIC die in the overmold body, the PIC die including electro-optical circuitry having an optical waveguide system;
    a plurality of optical fiber stubs operatively coupled to the optical waveguide system extending from a lateral side of the PIC die through a portion of the overmold body and protruding from a lateral side of the overmold die, wherein the plurality of optical fiber stubs are configured to optically couple to external optical fibers using an optical connector external to the overmold body;
    an edge fiber coupling interface in a lateral side of the overmold body for coupling the plurality of optical fiber stubs to the external optical fibers using the optical connector;
    an ancillary device in the overmold body;
    a redistribution wiring layer (RDL) interposer adjacent the overmold body and electrically connected to the PIC die and the ancillary device; and a ball grid array (BGA) electrically coupled to the PIC die and the ancillary device by the RDL interposer, the BGA configured to electrically couple the PIC die and the ancillary device to a printed circuit board (PCB).

12. The PIC fan-out package of claim 11, wherein the edge fiber coupling interface includes an alignment member for aligning the optical connector with the plurality of optical fiber stubs protruding from the lateral side of the overmold body.

13. The PIC fan-out package of claim 11, wherein a surface of the PIC die is exposed in an upper surface of the overmold body.

14. The PIC fan-out package of claim 13, further comprising a heat spreader thermally coupled to the exposed surface of the PIC die.

15. The PIC fan-out package of claim 11, wherein the ancillary device includes at least one of: a trans-impedance amplifier (TIA), a driver and a passive device.

16. The PIC fan-out package of claim 15, wherein a surface of the ancillary device is exposed in an upper surface of the overmold body, further comprising a heat spreader thermally coupled to the at least one of the TIA, the driver and the passive device.

17. The PIC fan-out package of claim 15, wherein the TIA is flip-chip coupled to the PIC die.

18. The PIC fan-out package of claim 11, wherein the ancillary device and the PIC die have coplanar surfaces at a location where each meets the RDL interposer.

19. The PIC fan-out package of claim 11, further comprising a laser die within the PIC die.

20. The PIC fan-out package of claim 11, further comprising another device mounted to an exterior surface of the overmold body.

* * * * *